United States Patent
Chen et al.

(10) Patent No.: US 10,528,697 B1
(45) Date of Patent: Jan. 7, 2020

(54) TIMING-CLOSURE METHODOLOGY INVOLVING CLOCK NETWORK IN HARDWARE DESIGNS

(71) Applicant: Xilinx, Inc., San Jose, CA (US)

(72) Inventors: Wei Chen, Palo Alto, CA (US);
Xiaojian Yang, Sunnyvale, CA (US);
Sabyasachi Das, San Jose, CA (US)

(73) Assignee: XILINX, INC., San Jose, CA (US)

( * ) Notice: Subject to any disclaimer, the term of this patent is extended or adjusted under 35 U.S.C. 154(b) by 100 days.

(21) Appl. No.: 15/818,436

(22) Filed: Nov. 20, 2017

(51) Int. Cl.
*G06F 17/50* (2006.01)

(52) U.S. Cl.
CPC ...... *G06F 17/5081* (2013.01); *G06F 17/5027* (2013.01); *G06F 2217/62* (2013.01)

(58) Field of Classification Search
CPC .................................................. G06F 17/5081
USPC .......................................... 716/108, 113, 134
See application file for complete search history.

(56) References Cited

U.S. PATENT DOCUMENTS

| | | | | |
|---|---|---|---|---|
| 5,446,764 A * | 8/1995 | Kondo | ...................... | H04J 3/07 370/468 |
| 5,646,546 A * | 7/1997 | Bertolet et al. | .... | H03K 19/1737 326/39 |
| 6,321,366 B1 * | 11/2001 | Tseng et al. | ........ | G06F 17/5022 326/94 |
| 7,472,365 B1 * | 12/2008 | Manaker, Jr. | ....... | G06F 17/5031 716/113 |
| 7,512,728 B2 * | 3/2009 | Tseng | ...................... | G06F 13/22 709/236 |
| 7,516,437 B1 * | 4/2009 | Kannan et al. | ..... | G06F 17/5077 716/126 |
| 7,714,610 B2 * | 5/2010 | He | ...................... | G06F 17/5054 326/38 |
| 8,095,900 B2 * | 1/2012 | Sircar et al. | .......... | G06F 17/505 716/104 |
| 8,595,671 B2 * | 11/2013 | He | ...................... | G06F 17/5054 716/116 |
| 8,745,561 B1 * | 6/2014 | Garg et al. | .......... | G06F 17/5031 703/16 |

(Continued)

OTHER PUBLICATIONS

Altera Netlist Optimization and Physical Synthesis, Quartus II Handbook, version 13.1, Nov. 2013. URL http://www.altera.com/literature/hb/qts/qts_qii52007.pdf, pp. 16-1 to 16-16.

(Continued)

*Primary Examiner* — Sun J Lin
(74) *Attorney, Agent, or Firm* — Patterson + Sheridan, LLP

(57) ABSTRACT

Embodiments disclosed herein describe techniques for moving nets between a source and a plurality of sinks in a design of an integrated circuit from a data network to a clock network. In one embodiment, the clock network propagates clock signals or timing signals throughout the integrated circuit while the data network transmits data signals between circuitry in the integrated circuit. In one embodiment, the clock network has a predefined number of clock signal nets which can be assigned to carry clock signals to circuit logic in the integrated circuit. However, some of the clock signal nets may be unused. In one embodiment, a design application identifies candidate sinks which have positive slack. If using the clock network to couple the sink to the source satisfies predetermined timing requirements, then the design change is committed.

20 Claims, 5 Drawing Sheets

(56) References Cited

U.S. PATENT DOCUMENTS

| | | | |
|---|---|---|---|
| 8,937,491 B2* | 1/2015 | Gaide et al. | G06F 1/10 |
| | | | 326/93 |
| 9,405,882 B1* | 8/2016 | Dhuria et al. | G06F 17/5031 |
| 2002/0152060 A1* | 10/2002 | Tseng | G06F 13/22 |
| | | | 703/17 |

OTHER PUBLICATIONS

Altera Timing Closure and Optimization, Quartus II Handbook, version 13.1, Nov. 2013. URL: http://www.altera.com/literature/hb/qts/qts_qii52007.pdf, pp. 12-1 to 12-46.

Synopsys Synplify Premier Brochure, 2011, URL: http://www.synopsys.com/tools/Implementation/FPGAImplementation/Documents/synpremier-brochure.pdf, 4 pages.

Pattison, Ryan et al., Gplace: A congestion-aware placement tool for UltraScale FPGAs, 2016 IEEE/ACM International Conference on Computer-Aided Design 35th ICCAD, Nov. 7-10, 2016, 7 pages, Austin, Texas.

Marrakchi, Zied et al., Congestion driven placement for Mesh-based FPGA architecture with local interconnect, 2011 IEEE 23rd ICM Proceeding, Dec. 19-22, 2011, Hammamet Tunisia.

Zhao, Jinpeng, et al., Fast congestion-aware timing-driven placement for island FPGA, IEEE 2009 12th DDECS International Symposium on Design and Diagnostics of Electronic Circuits & Systems, Apr. 15-19, 2009, pp. 24-27, Liberec, Czech republic.

\* cited by examiner

TIMING-CLOSURE METHODOLOGY INVOLVING CLOCK NETWORK IN HARDWARE DESIGNS

TECHNICAL FIELD

Examples of the present disclosure generally relate to moving data signal nets to a clock network in a hardware design.

BACKGROUND

Generating a design for a field programmable gate array (FPGA) can be complex process primarily due to the large number of circuitry elements in the design and aggressive timing requirements. A substantial amount of the design process is spent on closing the timing of the designs—i.e., ensuring the circuitry meets the timing requirements. As the number of design blocks and corresponding connections in a design increase so does congestion in the FPGA programmable logic which increases the amount of time needed by backend router tools to identify routes that satisfy the timing requirements.

SUMMARY

Techniques for moving data signal nets to a clock network are described. One example is a method that includes identifying a plurality of nets in a fan out of a source that have positive slack where the plurality of nets communicatively couple the source to respective sinks. Upon determining that a fixed-size clock network in an integrated circuit has available clock nets, the method includes changing the plurality of nets from a data network in the integrated circuit to the clock network, wherein the clock network carries clock signals for controlling sequential logic in the integrated circuit. The method includes determining respective slacks of the plurality of nets when in the clock network and committing the change for the plurality of nets that satisfy a predefined timing requirement when using the clock network.

One example described herein is a system that includes one or more processors and a memory including a program that when executed by the one or more processors performs an operation. The operation includes identifying a plurality of nets in a fan out of a source that have positive slack where the plurality of nets communicatively couple the source to respective sinks. The operation includes, upon determining that a fixed-size clock network in an integrated circuit has available clock nets, changing the plurality of nets from a data network in the integrated circuit to the clock network, wherein the clock network carries clock signals for controlling sequential logic in the integrated circuit. The operation includes determining respective slacks of the plurality of nets when in the clock network and committing the change for the plurality of nets that satisfy a predefined timing requirement when using the clock network.

One example described herein is a non-transitory computer readable storage medium that includes computer-readable program code, wherein, when executed by a computing processor, the computer-readable program code performs an operation. The operation includes identifying a plurality of nets in a fan out of a source that have positive slack where the plurality of nets communicatively couple the source to respective sinks. The operation includes, upon determining that a fixed-size clock network in an integrated circuit has available clock nets, changing the plurality of nets from a data network in the integrated circuit to the clock network, wherein the clock network carries clock signals for controlling sequential logic in the integrated circuit. The operation includes determining respective slacks of the plurality of nets when in the clock network and committing the change for the plurality of nets that satisfy a predefined timing requirement when using the clock network.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
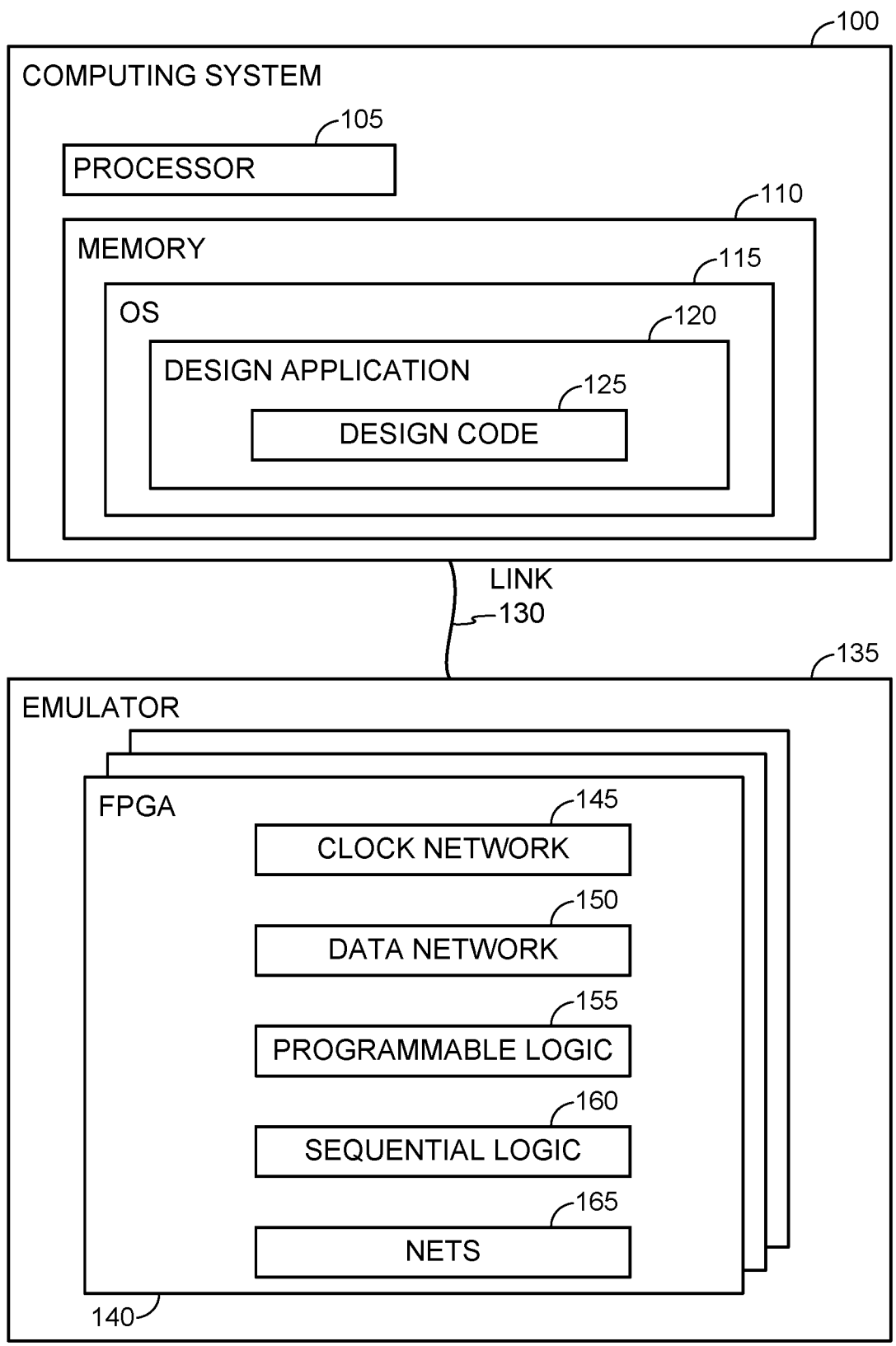
FIG. 1 is a block diagram of a computing system that uses a clock network to route data signals, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for moving nets between a source and sinks in a design of an integrated circuit from a data network to a clock network. In one embodiment, the clock network propagates clock or timing signals throughout the integrated circuit while the data network transmits data signals between circuitry in the integrated circuit. In one embodiment, the clock network has a predefined number of clock signal nets which can be assigned to carry clock signals to circuit logic in the integrated circuit. However, some of the clock signal nets may be unused. For example, in a FPGA, a particular design may not use all of the clock nets in which case the clock nets can be repurposed to serve as data nets which can mitigate congestion in the data network.

In one embodiment, the design application identifies sinks which have positive slack. As used herein, "slack" refers to the timing requirements set by the design for a data signal to propagate from a source to a sink. Positive slack indicates that the data signal arrives at a sink faster than required by the timing requirements while a negative slack indicates the data signal arrives at a sink slower than required. If moving a candidate sink from the data network to the clock network causes the sink to have negative slack, the design change is rejected. However, if the move results in the candidate sink still satisfying the timing requirements, then the design change is committed. In this manner, candidate sinks with positive slack can use the clock network to communicate with the source which can reduce data congestion in the data network and can simplify the task of identifying a design where all the sinks satisfy the timing requirements.

FIG. 1 is a block diagram of a system that uses a clock network to route data signals, according to an example. As shown, FIG. 1 includes a computing system 100 and an emulator 135. The computing system 100 includes a processor 105 and memory 110. The processor 105 represents any number of processing element which each can include one or more processing cores. The memory 110 can include volatile and non-volatile memory elements. Moreover, although shown as being part of the computing system 100, the memory 110 can also include remote memory devices.

The memory 110 includes an operating system (OS) 115 which can be any OS capable of performing the functions herein. The OS 115 executes a design application 120 which generates design code 125. In one embodiment, the design application 120 is a software application that performs synthesis and analysis of hardware defined language (HDL) designs. The design application 120 may enable the developer to synthesize (e.g., compile) their designs, perform timing analysis, examine register transfer level (RTL) diagrams, perform routing, and the like. In one embodiment, the design code 125 is RTL, a netlist, or HDL code that configures programmable logic in, for example, an FPGA 140.

In one embodiment, the design code 125 defines a design of an integrated circuit—e.g., an application specific integrated circuit (ASIC). However, before fabricating the ASIC, the developer may wish to test the design using the emulator 135. Emulation is similar to simulation except the design may be tested on actual hardware (e.g., the FPGAs) rather than a hardware model as in the case of simulator. As shown, the emulator 135 includes multiple FPGAs 140 which each includes a clock network 145, a data network 150, programmable logic 155, sequential logic 160, and nets 165. Before fabricating the integrated circuit, a developer can use the FPGAs 140 to test the design of the integrated circuit using the design code 125.

In one embodiment, the emulator 135 uses the design code 125 to configure the FPGAs 140 to perform the function that will be performed by the ASIC. The emulator 135 can configure the clock network 145, the data network 150, the programmable logic 155, the sequential logic 160, and the nets 165 to perform the desired functions. For example, the programmable logic 155 may include combinational elements (e.g., logic gates), digital signal processing elements, RAM, and the like. A first hardware element in the programmable logic 155 may serve as a source which transmits data to one or more second hardware elements (i.e., sinks) in the programmable logic 155 using nets 165. In one embodiment, the nets 165 may be implement using data nets in a data network 150 to communicatively couple the sources and sinks. In addition to programmable logic 155 and sequential logic 160, the FPGA 140 may also include other hardware elements such as multiplexers or RAM which are also coupled to the data network 150 and clock network 145.

However, the data network 150 can become congested in certain locations or regions in the FPGAs 140. In one embodiment, like the clock network 145, the data network 150 may have a fixed number of data nets or links within a defined region. For example, an FPGA 140 may have a set number of data nets in a defined region. The FPGAs 140 can be logically divided into different regions. If a large number of the hardware elements in the programmable logic 155 are active in the region, then the data network 150 may not have sufficient data nets for coupling the sources to the sinks which leads to congestion. Because of the congestion, some data nets may take indirect or circuitous paths in the FPGA to connect the sources and sinks which increases the propagation delay. Congestion can result in some of the data sinks failing the timing requirements for the design—i.e., the maximum time allowed for a signal to propagate between a source and a sink. Stated differently, the sinks may have negative slack. Moreover, the complexity of a design may cause the routing to fail if the router cannot find a solution (or times out while attempting to find the solution) even when the router sacrifices or ignores the timing requirements. This degrades the productivity of the router and increases the time required to configure the FPGA 140. The embodiments herein describe techniques for moving the sinks to the clock network 145 which may mitigate congestion and enable the emulator 135 to satisfy the timing requirements.

The clock network 145 may include multiple predefined clock nets (also referred to as clock tracks) for transmitting clock or timing signals throughout the FPGA 140. For example, the clock network 145 may assign clock nets to distribute clock signals to the sequential logic 160—e.g., flip flops or latches—in the FPGA 140. However, the clock network 145 may include more clock nets (e.g., assigned wires and switches) than are used by the design. The embodiments below describe moving the sinks that have positive slack from the data network 150 to the clock network 145 which may mitigate congestion so that configuring the FPGAs 140 may require less time and/or ensure the FPGAs 140 meet the timing requirements. Once the emulator 135 confirms the design works in the FPGAs 140, the design may then be used to fabricate the ASIC.

Although FIG. 1 illustrates changing the assignment of the nets 165 from using data nets to using clock nets when performing emulation, the techniques described herein can be used in other scenarios. For example, moving sinks to the clock network may improve the performance of an FPGA. Thus, when optimizing the FPGA 140 for speed, mitigating congestion in the data network 150 may increase the overall operational speed of the FPGA 140 even if the previous design already satisfied the timing requirements. For example, the embodiments herein may be used when the FPGA 140 is configured in a high-speed mode of operation rather than a low-power mode of operation. In another example, the embodiments herein may be used to configure the FPGA into a low-heat mode of operation since congestion in the data network may heat up the FPGA.

Although a FPGA 140 is specifically described, the embodiments herein can be used in any integrated circuit that includes a predefined number of nets assigned to the clock network 145. That is, if an integrated circuit (which may or may not contain programmable logic) includes extra or unused clock nets, switching logic in the integrated circuit may be used to change a sink from using the data network 150 to communicate with its source to using the clock network 145 instead.

Figure 2:
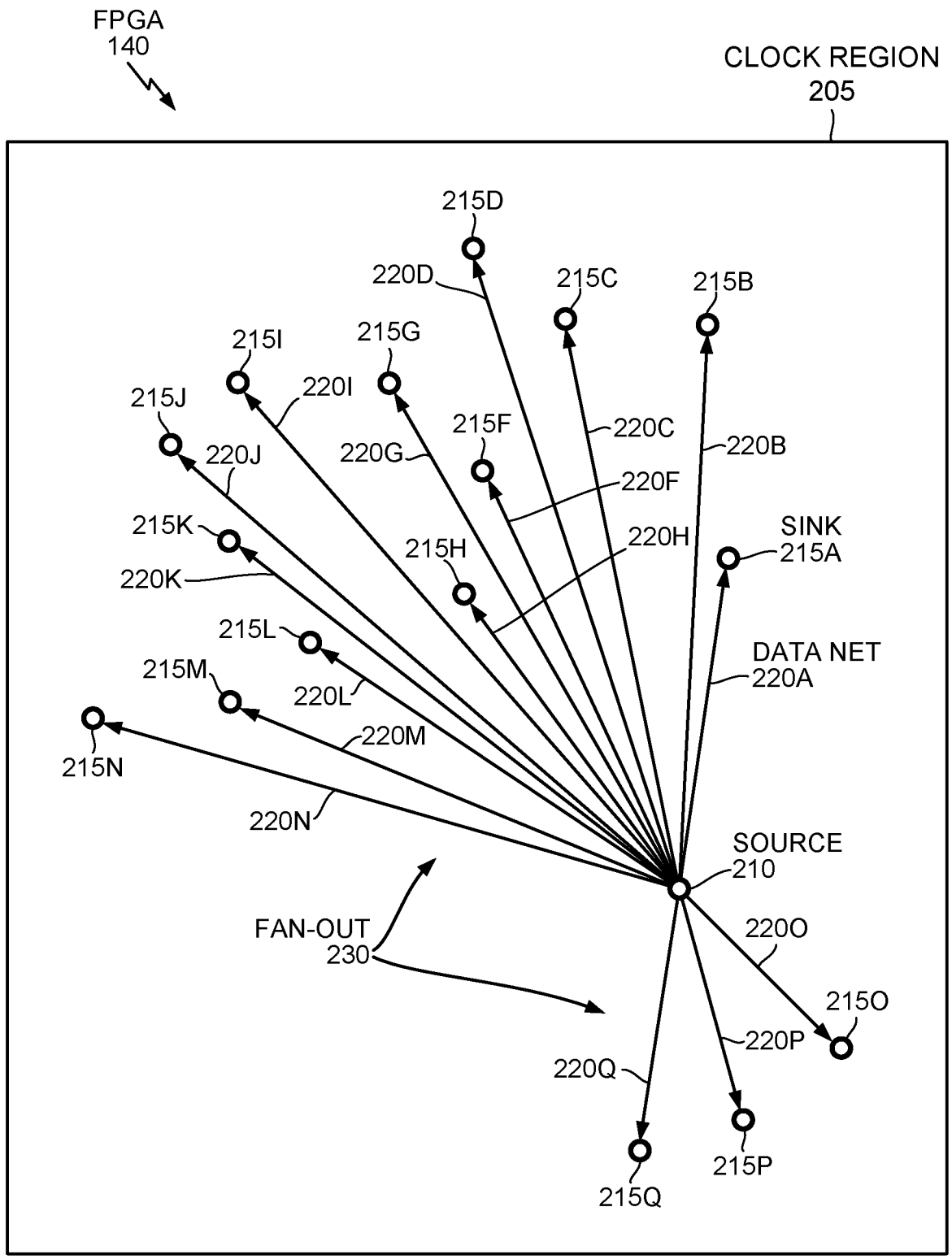
FIG. 2 illustrates a fan-out for a source that can cause congestion in a hardware design, according to an example.

FIG. 2 illustrates a fan-out for a source that can cause congestion in a hardware design, according to an example. The FPGA 140 includes a source 210 which has a fan-out 230 to multiple sinks 215—i.e., sinks 215A-215Q. For example, the source 210 may be a driver circuit which transmits the same data to all the sinks 215 (e.g., combinational logic). FIG. 2 illustrates a clock region 205 of the FPGA 140 which may be a logical partition of the FPGA 140. For example, the FPGA 140 may be divided into multiple different clock regions which are used when configuring the FPGA 140. In one embodiment, instead of attempting to place and communicatively couple the hardware elements in the entire FPGA 140, the design application may first assign circuitry to one of the clock regions 205 and then select where to place the circuitry (e.g., which programmable logic to use) and how to interconnect the sources and sinks. Doing so may reduce the time used to implement the design code in the FPGA 140.

The sinks 215 are connected to the source 210 using respective data nets 220 (or links). In one embodiment, the data nets 220 are connected to the output of the source 210 so that each of the sinks 215 receives the generated output of the source 210. Although the data nets 220 are shown as straight lines, this is for ease of illustration. Because of congestion or the layout of the data network in the clock region 205, the data nets 220 may follow non-linear paths between the source 210 and the sinks 215.

As shown, the sinks 215 may be located at different places in the clock region 205. For example, the fan-out 230 of the source 210 includes sinks that are located above and below the source 210 within the clock region 205. If there is another source with a large fan out disposed near the source 210, these sources may compete with the limited nets in the data network to reach all of the sinks 215. As the competition for the data nets 220 increases, the path for the data nets 220 may be more circuitous as the design application searches for available data nets which may not be disposed directly between the source 210 and the sinks 215.

As the data nets 220 become more circuitous, the slack may also increase. For some sinks 215, the slack may become negative which means a timing requirement is not satisfied. In this manner, congestion can prevent a design from converging (i.e., the design application cannot find a configuration of the FPGA that satisfies the timing requirements). The design application may have to move the circuitry to different clock regions to find a solution that converges.

Figure 3:
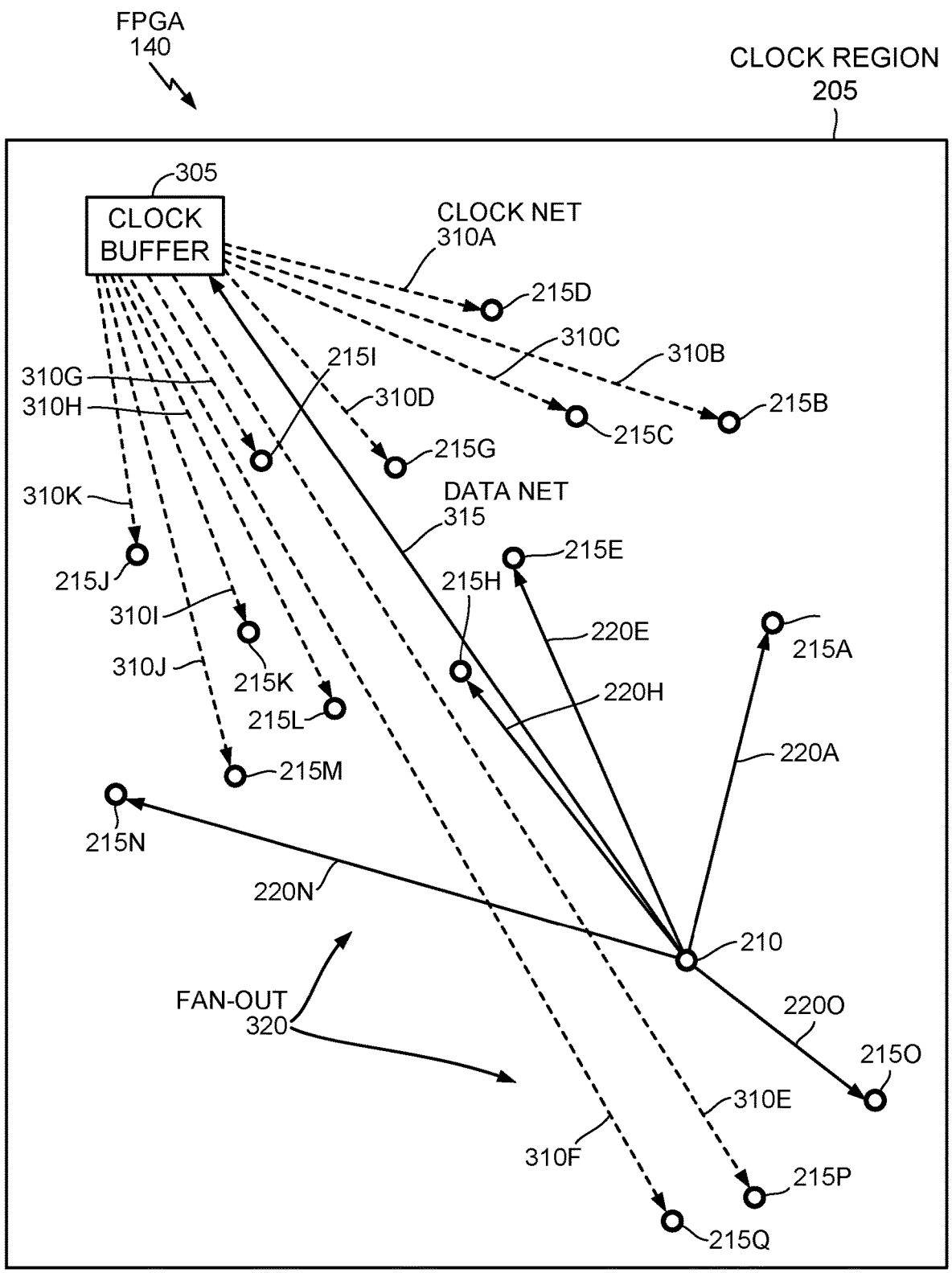
FIG. 3 illustrates moving nets for a source to the clock network to reduce congestion, according to an example.

FIG. 3 illustrates using the clock network to communicatively couple some of the sinks 215 to the source 210 to reduce congestion, according to an example. FIG. 3 illustrates the state of the clock region 205 shown in FIG. 2 after moving some of the sinks 215 from the data network to the clock network. To enable the sinks 215 to use the clock nets 310, the design application identifies a clock buffer 305 in the clock region 205. For example, the FPGA 140 may already have a predefined number of clock buffers 305 within the clock region 205. In one embodiment, the design application identifies the clock buffer 305 closest to the source 210.

The input of the clock buffer 305 is coupled to the data network while the output of the clock buffer 305 couples to the clock network. To communicatively couple the clock buffer 305 to the source 210, the design application activates a data net 315 which is also coupled to the output of the source 210 like the data nets 220. The clock buffer 305 receives the data from the source 210 and then forwards that data to the sinks 215 using respective clock nets 310. In this example, the sinks 215B, 215C, 215D, 215G, 215I, 215L, 215K, 215M, 215P, and 215Q are coupled to the clock buffer 305 using respective clock nets 310 rather than being coupled directly to the source 210 using data nets 220. Put differently, coupling the source 210 to the clock buffer 305 using the data net 315, many of the sinks 215 receive the output of the source 210 using the clock network. As a result, the data nets 220B, 220C, 220D, 220G, 220I, 220L, 220K, 220M, 220P, and 220Q are free to be used by other sources and sinks in the clock region 205. For example, if the design includes sinks that violate the timing requirements, the design application can determine if those sinks can be use the data nets 220 that have become available by using the clock buffer 305 and the clock nets 310.

As shown, the clock buffer 305 can couple to sinks 215 that are located above or below the source 210. That is, the design application may couple the clock buffer 305 to sinks 215 that are closer to the clock buffer 305 as well as sinks that are closer to the source 210—e.g., the sinks 215P and 215Q. In one embodiment, the clock buffer 305 can be coupled to any of the sinks 215 so long as doing so does not violate the timing requirements. For example, even though coupling the source 210 directly to the sinks 215P and 215Q may result in more positive slack than coupling these sinks to the clock buffer 305 (since these sinks are closer to the source 210), the design application can nonetheless use the clock nets 310E and 310F to forward data to the sinks 215P and 215Q if the resulting data paths do not have negative slack.

Some of the sinks 215 remain directly coupled to the source 210. For example, the sinks 215A, 215E, 215H, 215N, and 215O remain coupled to the source 210 using the data nets 220A, 220E, 220H, 220N, and 220O. The design application may not have used clock nets 310 for these sinks 215 for any number of reasons, e.g., the clock network may not have any more available clock nets or doing so may result in negative slack. Thus, the design application may not convert all of the data nets into clock nets in a fan out 320 of the source 210.

Although FIGS. 2 and 3 illustrate the result of moving data nets to clock nets on the FPGA 140, the design application may decide which sinks 215 are connected to the source 210 using data nets or clock nets before configuring the FPGA 140. That is, the design application may alter the design code (e.g., RTL, netlist, or HDL code) to convert some or all of the data nets 220 in the fan out 320 into clock nets 310 before the design code is used to configure the FPGA 140.

Figure 4:
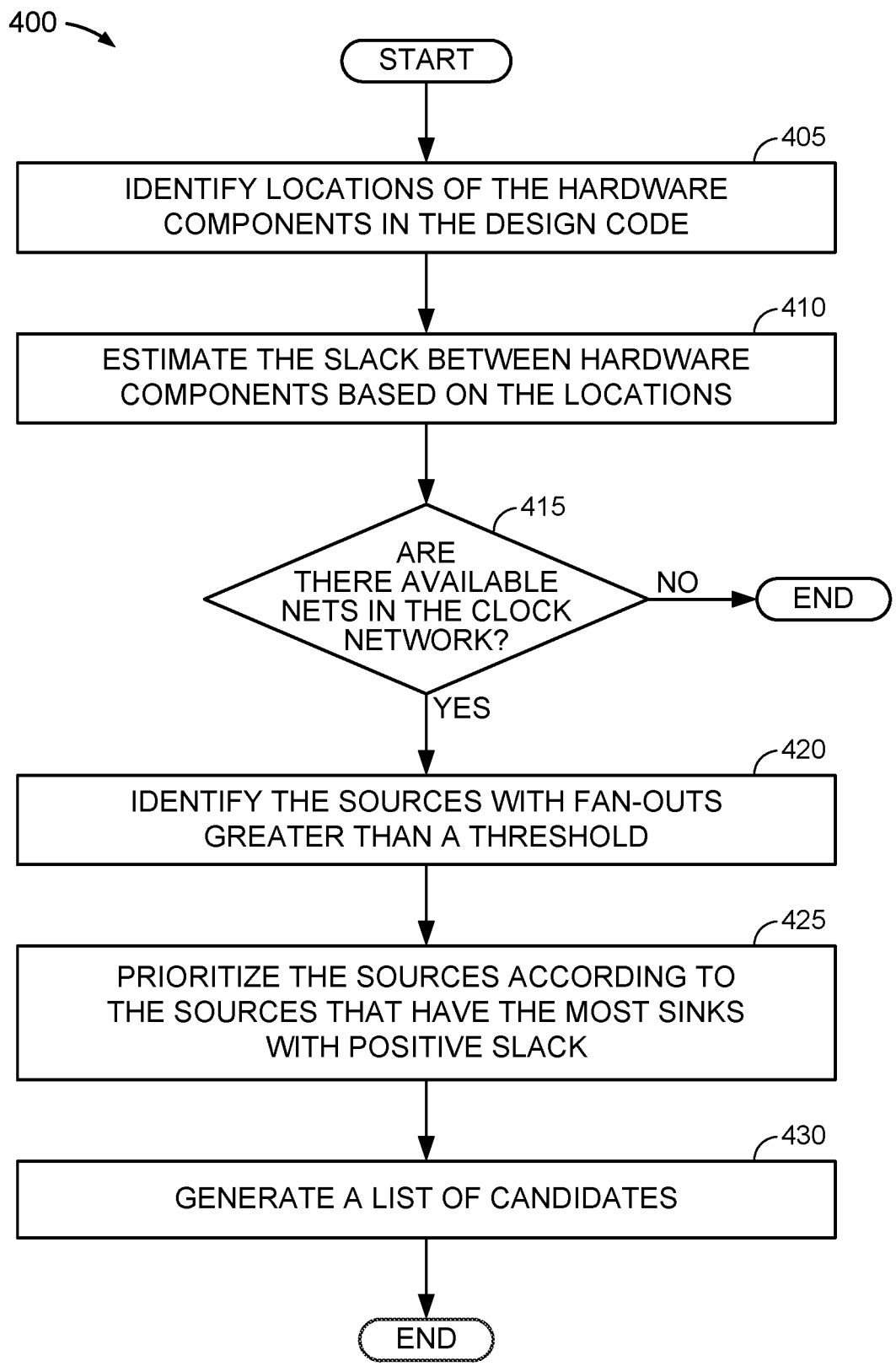
FIG. 4 is a flowchart for identifying candidate sources with positive slack, according to an example.

FIG. 4 is a flowchart of a method 400 for identifying candidate sources with nets that have positive slack, according to an example. The method 400 begins at block 405 where the design application identifies locations of the hardware components in an integrated circuit (e.g., an FPGA). Stated differently, the design application places (or assigns) the hardware components in specific regions in the FPGA. For example, if the FPGA is logical divided into different regions (e.g., clock regions), the design application assigns the hardware components into one of the regions. In one embodiment, the design application may not yet know the specific location of the hardware component in the region. Thus, the locations of the hardware components may be an estimated location. In later steps, the design application may identify the particular combinational logic that is configured into the hardware components in the design code.

In one embodiment, placement may be performed in multiple steps. For example, during block 405 the design application assigns the hardware components in the design to a circuit block in the FPGA and then in later steps identifies the particular hardware in circuit block to use when implementing the design.

In one embodiment, the method 400 is performed any time after placement has been performed. For example, method 400 can be performed during or after physical synthesis or routing. Although the exact locations of the hardware components (e.g., the sources and sinks) may not be known, the design application can still estimate the slack for the sinks. Once routing is performed (i.e., the specific locations of the data nets are chosen), method 400 can be re-run to see if additional sinks can use clock nets instead of data nets or if sinks that were previously moved to the clock network now have negative slack and should be moved back into the data network.

At block 410, the design application estimates the slack between the hardware components using the locations assigned at block 405. That is, the design application determines whether the propagation time between the various sources and sinks violate the timing requirements for the design. In one embodiment, the design application determines, for each sink in the fan-out of a source, whether the sink has positive or negative slack.

As mentioned above, at this point in the design process, the design application may not have determined the exact locations of the source and sinks or the paths of the data nets connected them. Nonetheless, based on congestion and a rough distance between the source and sinks, the design application can estimate the propagation time between the source and sinks. The method 400 may repeat when more accurate propagation times are determined.

At block 415, the design application determines whether there are available nets or tracks in the clock network. In one embodiment, the clock network includes a fixed or predefined number of clock nets which does not change. That is, the clock network is already designed and placed in the hardware of the FPGA, and thus, cannot be moved or rearranged. Put differently, the placement of the hardware is completed or very close to completion so that the locations of the hardware is known so a clock net reachability check for each potential sink as described herein can be performed. If the design already uses all of the nets in the clock network, then there are no clock nets available to be used to transmit data signals. As such, the method 400 ends. However, if the design code does not already use all the clock nets, then the method 400 proceeds to block 420 to select sources which have data nets that can be moved into the clock network.

In one embodiment, the design application determines the number of available clock nets in the clock network after synthesizing the design code.

At block 420, the design application identifies the sources with fan outs greater than a threshold. In one embodiment, the design application uses the threshold to identify candidate sources for moving their corresponding sinks into the clock network. Any sources that have fan outs smaller than the threshold (e.g., less than one hundred sink pin nets) are not considerate as candidates.

At block 425, the design application prioritizes the sources according to which sources have nets with the most data sinks that have positive slack. For example, a first source that has two thousand data sinks with positive slack is given a higher priority than a second source that has one thousand data sinks with positive slack. In one embodiment, the first source is assigned a higher priority even if the second source has a greater percentage of data sinks with positive slack. For example, 50% of the data sinks for the second source may have positive slack while only 25% of the data sinks for the first source have positive slack. Nonetheless, the design application may give a higher priority to the first source since it has the potential to convert the most number of data sinks into clock sinks.

At block 430, the design application generates a list of prioritized list of candidate sources. For example, the sources with the most number of data sinks with positive slack may be listed first while the sources with the least number of data sinks are listed last. However, other factors can be used to prioritize and sort the sources in the list of candidates. For example, the sources can be sorted by the average positive slack of the data sinks. For instance, two sources may have the same number of data sinks with positive slack, but the data sinks for one of the sources may have a higher average of positive slack, and thus, be prioritized higher since it might be easier to move these data sinks to the clock network.

Figure 5:
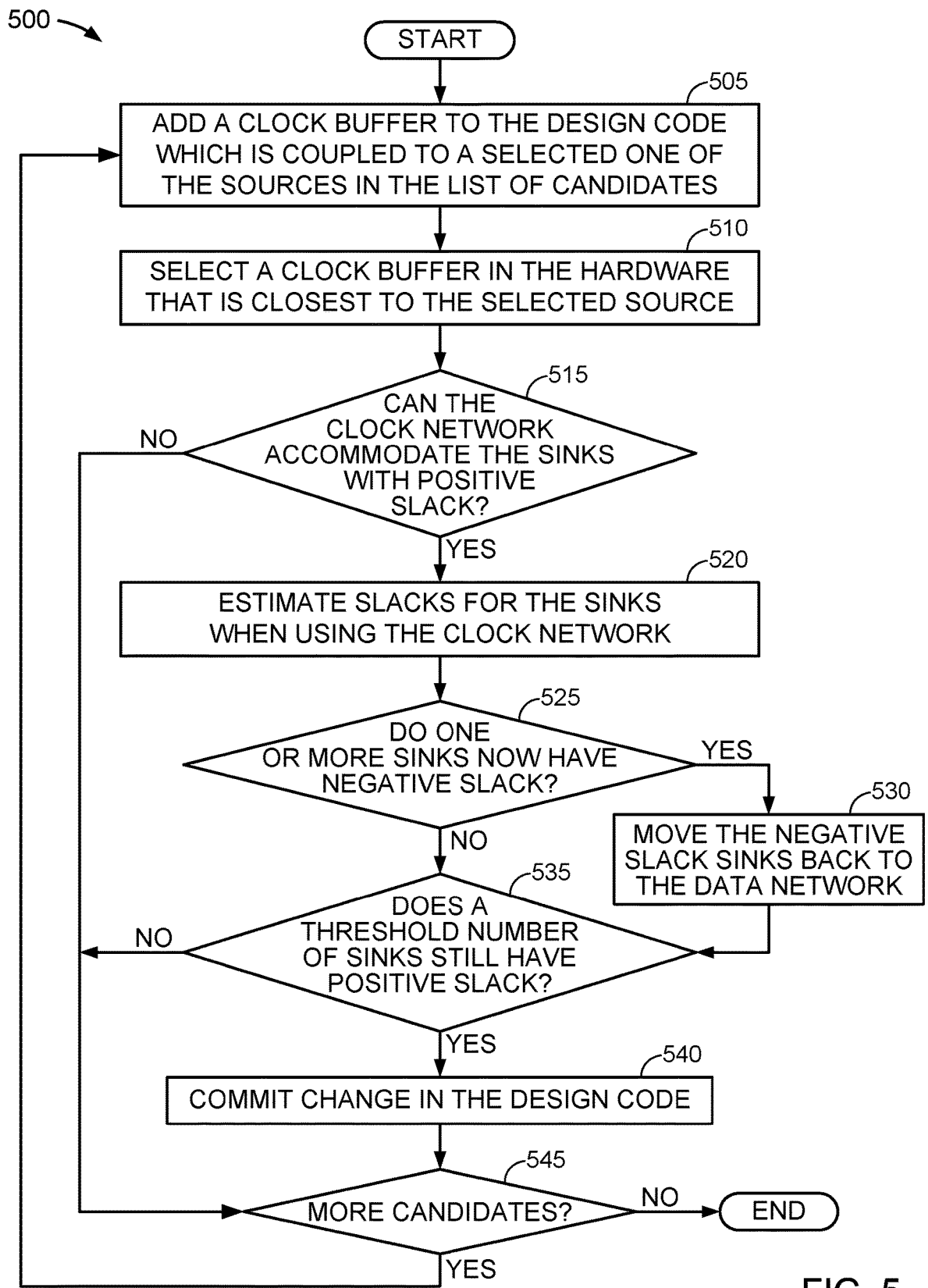
FIG. 5 is a flowchart for moving nets for a candidate source to the clock network, according to an example.

FIG. 5 is a flowchart of a method 500 for moving data sinks for a candidate source to the clock network, according to an example. The method 500 begins at block 505 where the design application adds a clock buffer to the design code which is coupled to a selected one of the sources in the list of candidates. For example, the design application may start with the source that has the highest priority.

In one embodiment, the design application identifies a clock buffer that is closest to the currently selected source. For example, a clock region may have multiple clock buffers that enable the source to use the clock network to route data to its corresponding sinks. Choosing the clock buffer closest to the source may reduce the latency added when converting data sinks into clock sinks.

In another embodiment, the design application may identify a clock buffer that is closest to the greatest number of the sinks. Although the clock buffer may be further from the selected source than other clock buffers, the clock sinks to the sinks may be shorter which may result in more of the clock sinks having positive slack.

At block 515, the design application determines whether the clock network can accommodate the data sinks with positive slack. For example, the source may have two thousand data sinks with positive slack but the clock network may have only fifteen hundred available clock sinks. In one embodiment, if the clock network does not have enough available routing resources for all of the data sinks with positive slack in the fan out of the source, the method 500 proceeds to block 545 where the design application determines whether there are remaining sources in the list of candidates. Put differently, the design application may treat the data sinks for the source as a whole and evaluate the data sinks only if the clock network has the availability to move all of the data sinks to the clock network.

However, in another embodiment, the design application may continue with method 500 (i.e., proceed to block 520) and select a number of data sinks to evaluate that matches the availability of the clock network. Continuing the previous example, the source may have five hundred more data sinks with positive slack than the clock network has available routing resources. In one embodiment, the design application may exclude from consideration the five hundred data sinks with the least amount of positive slack, and thus, keep the data sinks with the greatest positive slack.

At block 520, the design application estimates the slack for the sinks when using the clock network. The design application identifies the clock nets that can be used to couple the clock buffer to the sinks which were previously coupled to data network which have positive slack. Instead of using the data nets to directly receive the output of the source, the sinks receive the source data from the clock buffer using clock nets. In one embodiment, the design application uses a data net to couple the output of the source to the clock buffer. For example, the clock buffer may include a hook or other circuitry device that permits the clock buffer to connect a data net in the data network to clock nets in the clock network.

As above, the precise locations of the sinks may not be known. That is, the design application may not have selected which specific combinational logic or sequential logic in the FPGA is assigned to the sinks. Nonetheless, the sinks may have been assigned to general circuit blocks or regions from which the design application selects specific logic to implement the hardware circuitry in the design code in later steps. Using these general locations, the design application estimates the slack using the clock network and the clock buffer to transmit the output of source to the sinks.

At block 525, the design application determines whether one or more of the sinks now have negative slack. Put differently, the design application determines if converting the data nets into clock nets causes the sinks to have negative slack rather than positive slack thereby violating the timing requirements for the design. The design application can evaluate the slack for each of the sinks that use the clock network to ensure these sinks still satisfy the predefined timing requirements for the design, or at least to ensure that the sinks do not have negative slack. For example, the predefined timing requirements may set a maximum timing threshold by which data signals should arrive at the sinks.

If some of the sinks now have negative slack, the method 500 proceeds to block 530 where the design application moves the negative slack sinks back to the data network. That is, instead of receiving the data from the clock buffer using clock nets, the design application changes the design code so that the sinks with the negative nets are coupled to the source using a data net as before. As such, the only sinks moved to the clock network are the ones that do not have negative slack.

Some of the sinks that use the data network to received data from the source may still have negative slack which could be due to congestion. However, after performing method 500 for the candidate sources, many of the sinks previously using the data network may be moved to the clock network which can mitigate congestion—i.e., free up additional routing resources in the data network. The design application can then re-route the sinks with negative slack to use some of the newly available data network routes which may provide more direct routes between the source and the sinks. If the design still includes sinks with negative slack, the design application may move the hardware elements to different locations in the FPGA which may be less congested to find a solution that converges in less time and satisfies the timing requirements. In this manner, the embodiments herein can improve the functioning of the computing system executing the design application.

At block 535, the design application determines whether a threshold number of sinks still have positive slack. That is, after removing any sinks from the clock network that have negative slack at block 530, the design application determines whether the number of sinks still using the clock network are above the threshold. For example, the source may have had a thousand sinks with positive slack, but once those sinks now use the clock network, only a hundred of the sinks do not have negative slack. If this is less than the threshold, the method 500 proceeds to block 545 where other candidate sources are considered (i.e., the change is not made). Stated differently, the design application may consider a source that has a lower priority than the current source being evaluated (e.g., fewer sinks with positive slack) but may ultimately have more sinks that can be moved into the clock network. For example, a second source may have only eight hundred sinks with positive slack, and after moving those sinks into the clock network, five hundred of those sinks may still satisfy the timing requirements which may be above the threshold and is a more efficient use of the available clock nets in the clock network.

If the number of sinks now using the clock network meet or exceed the threshold, the method 500 proceeds to block 540 where the design application commits the change in the design code. That is, the design application keeps the change made in RTL or the netlist where a portion of the sinks now use the clock network to communicate with the source.

At block 545, the design application continues to the next candidate source to determine if sinks for another source can be moved from the data network to the clock network. If not (i.e., the design application has exhausted the list of source candidates), the method 500 ends. In another embodiment, the design application may also consider whether there are still available routing resources in the clock network. That is, if after committing the change at block 540 there are no more available clock nets, the method 500 ends rather than continuing to evaluate any additional candidate sources.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects described herein may take the form of an entirely hardware embodiment, an entirely software embodiment (including firmware, resident software, micro-code, etc.) or an embodiment combining software and hardware aspects that may all generally be referred to herein as a "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, FPGAs, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method comprising:
   identifying a plurality of sinks, that have positive slacks, in a fan out of a source, wherein the plurality of sinks are communicatively coupled to the source using a data network;
   upon determining that a clock network of a fixed size in an integrated circuit has available clock nets, coupling the plurality of sinks to the source using the clock network instead of the data network, wherein the clock network carries clock signals for controlling sequential logic in the integrated circuit;
   determining respective slacks of the plurality of sinks when using the clock network; and
   committing the change for the plurality of sinks that satisfy a predefined timing requirement when using the clock network.

2. The method of claim 1, further comprising:
upon determining at least one of the plurality of sinks has negative slack when in the clock network, moving the at least one of the plurality of sinks from the clock network back to the data network.

3. The method of claim 1, further comprising:
identifying a clock buffer in the integrated circuit;
coupling, in design code, the source to the clock buffer using a data net in the data network; and
coupling, in the design code, the clock buffer to the sinks corresponding to the plurality of sinks that satisfy the predefined timing requirement.

4. The method of claim 3, wherein the clock buffer is an interface between the data network and the clock network, wherein the clock buffer is coupled to the plurality of sinks using a plurality of clock traces.

5. The method of claim 1, further comprising:
identifying a plurality of sources that each have a respective fan out greater than a first threshold; and
prioritizing the plurality of sources to generate a list of candidates based on a number of sinks in the respective fan outs that have positive slack.

6. The method of claim 5, further comprising:
iterating through the list of candidates based on the prioritization to determine whether to change corresponding sinks from the data network to the available clock nets in the clock network.

7. The method of claim 1, further comprising, before committing the change:
determining that the plurality of sinks that satisfy the predefined timing requirement satisfies a threshold number of sinks.

8. The method of claim 1, wherein the integrated circuit is logically divided into a plurality of clock regions, wherein the source and the plurality of sinks are assigned to a first clock region of the plurality of clock regions.

9. The method of claim 1, wherein the data network is a fixed size and the data network and clock network are implemented in a field programmable gate array (FPGA).

10. The method of claim 1, further comprising:
determining the plurality of sinks satisfy the predefined timing requirement by determining data transmitted using the clock network arrives before, or at, a maximum timing threshold.

11. A system, comprising:
one or more processors; and
a memory comprising a program that when executed by the one or more processors performs an operation, the operation comprising:
identifying a plurality of sinks, that have positive slack, in a fan out of a source, wherein the plurality of sinks are communicatively coupled to the source using a data network;
upon determining that a clock network of a fixed size in an integrated circuit has available clock nets, coupling the plurality of sinks to the source using the clock network instead of the data network, wherein the clock network carries clock signals for controlling sequential logic in the integrated circuit;
determining respective slacks of the plurality of sinks when using the clock network; and
committing the change for the plurality of sinks that satisfy a predefined timing requirement when using the clock network.

12. The system of claim 11, wherein the operation further comprises:
upon determining at least one of the plurality of sinks has negative slack when in the clock network, moving the at least one of the plurality of sinks from the clock network back to the data network.

13. The system of claim 11, wherein the operation further comprises:
identifying a clock buffer in the integrated circuit;
coupling, in design code, the source to the clock buffer using a data net in the data network; and
coupling, in the design code, the clock buffer to the sinks corresponding to the plurality of sinks that satisfy a predefined timing requirement.

14. The system of claim 13, wherein the clock buffer is an interface between the data network and the clock network, wherein the clock buffer is coupled to the plurality of sinks using a plurality of clock traces.

15. The system of claim 11, further comprising:
an emulator configured to emulate a hardware system, wherein the emulator contains the integrated circuit.

16. A non-transitory computer readable storage medium comprising:
computer-readable program code, wherein, when executed by a computing processor, the computer-readable program code performs an operation comprising:
identifying a plurality of sinks, that have positive slack, in a fan out of a source, wherein the plurality of sinks are communicatively coupled to the source using a data network;
upon determining that a clock network of a fixed size in an integrated circuit has available clock nets, coupling the plurality of sinks to the source using the clock network instead of the data network, wherein the clock network carries clock signals for controlling sequential logic in the integrated circuit;
determining respective slacks of the plurality of sinks when using the clock network; and
committing the change for the plurality of sinks that satisfy a predefined timing requirement when using the clock network.

17. The computer readable storage medium of claim 16, wherein the operation further comprises:
upon determining at least one of the plurality of sinks has negative slack when in the clock network, moving the at least one of the plurality of sinks from the clock network back to the data network.

18. The computer readable storage medium of claim 16, wherein the operation further comprises:
identifying a clock buffer in the integrated circuit;
coupling, in design code, the source to the clock buffer using a data net in the data network; and
coupling, in the design code, the clock buffer to the sinks corresponding to the plurality of sinks that satisfy a predefined timing requirement.

19. The computer readable storage medium of claim 18, wherein the clock buffer is an interface between the data network and the clock network, wherein the clock buffer is coupled to the plurality of sinks using a plurality of clock traces.

20. The computer readable storage medium of claim 16, wherein the operation further comprises:
identifying a plurality of sources, wherein each of the plurality of sources has a fan out greater than a first threshold; and prioritizing the plurality of sources to generate a list of candidates based on a number of sinks in the respective fan outs that each has a positive slack.

\* \* \* \* \*